US012661890B2

(12) United States Patent
Hamada et al.

(10) Patent No.: US 12,661,890 B2
(45) Date of Patent: Jun. 23, 2026

(54) DROPLET EJECTION HEAD AND PRINTER

(71) Applicant: SEIKO EPSON CORPORATION,
Tokyo (JP)

(72) Inventors: Yasuaki Hamada, Chino (JP);
Yasuhiro Itayama, Kai (JP); **Koji
Ohashi, Matsumoto (JP); Kazuya
Kitada, Matsumoto (JP); Yoshiki Yano**,
Chino (JP); Masao Nakayama, Shiojiri
(JP)

(73) Assignee: Seiko Epson Corporation, Tokyo (JP)

( * ) Notice: Subject to any disclaimer, the term of this
patent is extended or adjusted under 35
U.S.C. 154(b) by 162 days.

(21) Appl. No.: 18/192,337

(22) Filed: Mar. 29, 2023

(65) Prior Publication Data

US 2023/0311506 A1    Oct. 5, 2023

(30) Foreign Application Priority Data

Mar. 31, 2022    (JP) ................................. 2022-058924

(51) Int. Cl.
*B41J 2/14* (2006.01)
*H10N 30/00* (2023.01)
*H10N 30/853* (2023.01)
*H10N 30/87* (2023.01)

(52) U.S. Cl.
CPC ........ *B41J 2/14274* (2013.01); *H10N 30/704*
(2024.05); *H10N 30/8542* (2023.02); *H10N
30/871* (2023.02); *H10N 30/878* (2023.02)

(58) Field of Classification Search
None
See application file for complete search history.

(56) References Cited

U.S. PATENT DOCUMENTS

| | | | | |
|---|---|---|---|---|
| 2005/0140249 A1* | 6/2005 | Kita | ..................... | H10N 30/802 |
| | | | | 310/359 |
| 2006/0152556 A1* | 7/2006 | Sugahara | ............... | B41J 2/1646 |
| | | | | 347/71 |
| 2013/0009519 A1* | 1/2013 | Shibata | ................. | C23C 14/088 |
| | | | | 310/348 |
| 2020/0105995 A1* | 4/2020 | Kitada | ................. | H10N 30/067 |

FOREIGN PATENT DOCUMENTS

JP          2011-148287 A        8/2011

* cited by examiner

*Primary Examiner* — Alejandro Valencia
(74) *Attorney, Agent, or Firm* — Spencer Fane LLP

(57)                ABSTRACT

A droplet ejection head includes a nozzle plate having a
nozzle, a pressure chamber forming substrate having a
pressure chamber, a vibration plate, and a piezoelectric
element containing potassium, sodium, and niobium and
formed on the vibration plate. The piezoelectric element
includes a first electrode, a second electrode, and a piezo-
electric layer located between the first electrode and the
second electrode. A total thickness of the piezoelectric layer,
the first electrode, and the second electrode is larger than a
thickness of the vibration plate. An absolute value of a
displacement amount of the vibration plate when a voltage
having an absolute value of 25 V is applied to the piezo-
electric element as a voltage for displacing the vibration
plate in a direction in which a volume of the pressure
chamber expands is twice or more an absolute value of a
displacement amount of the vibration plate when a voltage
having an absolute value of 25 V is applied to the piezo-
electric element as a voltage for displacing the vibration
plate in a direction in which a volume of the pressure
chamber contracts.

5 Claims, 7 Drawing Sheets

FIG. 5D
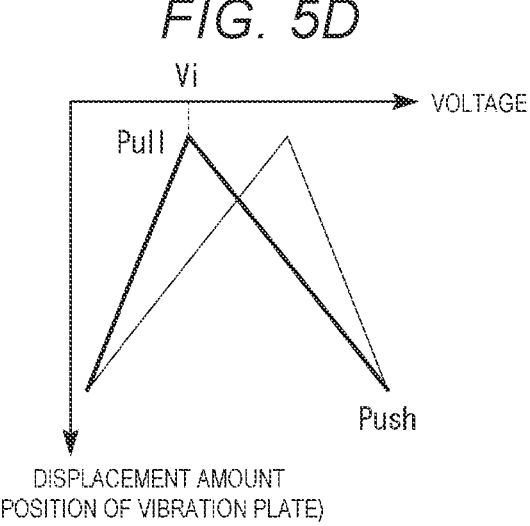
DISPLACEMENT AMOUNT
(POSITION OF VIBRATION PLATE)
FIG. 6A
FIG. 6B
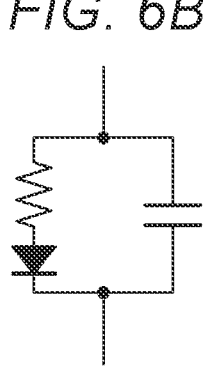

DROPLET EJECTION HEAD AND PRINTER

The present application is based on, and claims priority from JP Application Serial Number 2022-058924, filed on Mar. 31, 2022, the disclosure of which is hereby incorporated by reference herein in its entirety.

BACKGROUND

1. Technical Field

The present disclosure relates to a droplet ejection head and a printer.

2. Related Art

In related art, for example, as disclosed in JP-A-2011-148287, there is known a driving method for correcting a driving voltage waveform of a piezoelectric element in order to prevent an undershoot, an overshoot, and the like due to a change in a driving voltage caused by a change in the number of simultaneously ejecting nozzles in an inkjet head.

However, a cause of the overshoot is not limited to the change in the number of ejecting nozzles. For example, when a driving pulse supplied to the piezoelectric element has a high frequency, bending deformation of a vibration plate cannot follow switching from a rising period of the driving waveform to a voltage holding period, and an overshoot occurs.

In addition, abnormal ejection of droplets due to the occurrence of overshoot is likely to occur in a droplet ejection head including a piezoelectric element using a piezoelectric material having a low piezoelectric constant. Examples of the piezoelectric material having a low piezoelectric constant include potassium sodium niobate (hereinafter abbreviated as KNN). A piezoelectric element using KNN as a main material has a smaller displacement amount of the vibration plate than that of a piezoelectric element using lead zirconate titanate (hereinafter abbreviated as PZT). Therefore, in the piezoelectric element using KNN as the main material, the displacement amount of the vibration plate is increased by reducing rigidity of the vibration plate by reducing a thickness thereof. However, when the thickness of the vibration plate is reduced, unintended displacement of the vibration plate is likely to occur as overshoot occurs, and as a result, abnormal ejection of droplets is likely to occur.

SUMMARY

According to an aspect of the present disclosure, there is provided a droplet ejection head including: a nozzle plate having a nozzle configured to eject a liquid as droplets; a pressure chamber forming substrate having a pressure chamber continuous to the nozzle; a vibration plate forming a part of a wall surface of the pressure chamber; and a piezoelectric element containing potassium, sodium, and niobium and formed on the vibration plate. The piezoelectric element includes a first electrode, a second electrode, and a piezoelectric layer located between the first electrode and the second electrode. A total thickness of the piezoelectric layer, the first electrode, and the second electrode is larger than a thickness of the vibration plate. An absolute value of a displacement amount of the vibration plate when a voltage having an absolute value of 25 V is applied to the piezoelectric element as a voltage for displacing the vibration plate in a direction in which a volume of the pressure chamber expands is twice or more an absolute value of a displacement amount of the vibration plate when a voltage having an absolute value of 25 V is applied to the piezoelectric element as a voltage for displacing the vibration plate in a direction in which a volume of the pressure chamber contracts.

BRIEF DESCRIPTION OF THE DRAWINGS

FIG. 5D is a schematic diagram showing a displacement behavior of the vibration plate 230 with respect to an applied voltage.

FIG. 6A is a circuit diagram showing a general piezoelectric element.

FIG. 6B is a circuit diagram showing a piezoelectric element having asymmetry due to a voltage application direction.

DESCRIPTION OF EXEMPLARY EMBODIMENTS

Figure 1:
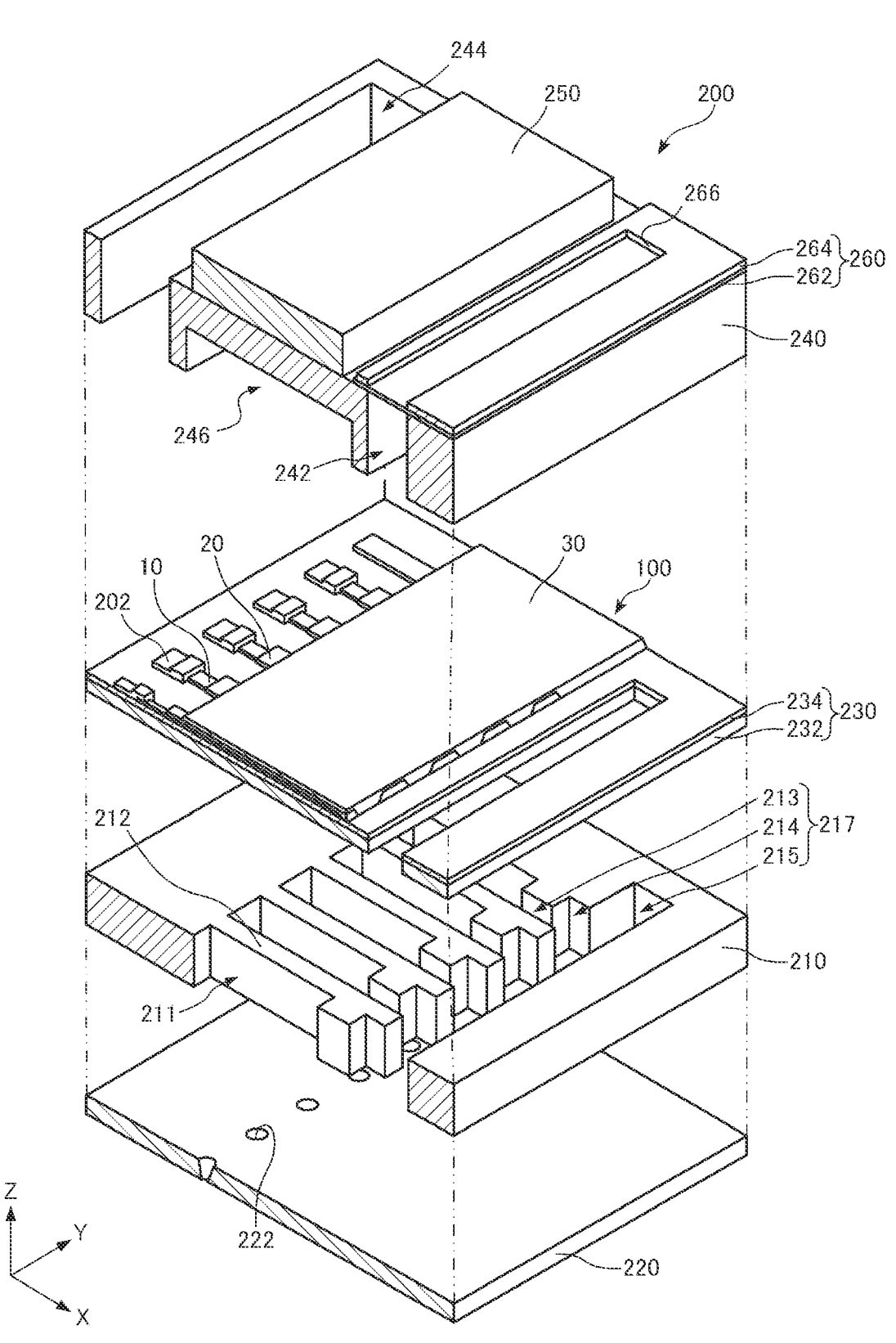
FIG. 1 is an exploded perspective view schematically showing a droplet ejection head 200 according to an embodiment.

Hereinafter, embodiments according to the present disclosure will be described with reference to the drawings. The following description shows an aspect of the present disclosure, and can be changed as desired within the scope of the present disclosure. The same components are denoted by the same reference numerals in the drawings, and description thereof will be omitted as appropriate. In each drawing, X, Y, Z represent three spatial axes orthogonal to one another. In the present specification, directions along these axes will be described as an X-axis direction, a Y-axis direction, and a Z-axis direction, respectively. The Z-axis direction represents a thickness direction or a lamination direction of a plate, a layer, and a film. The X-axis direction and the Y-axis direction represent in-plane directions of the plate, the layer, and the film.

A liquid ejection head according to an embodiment will be described with reference to the drawings.

Figure 2:
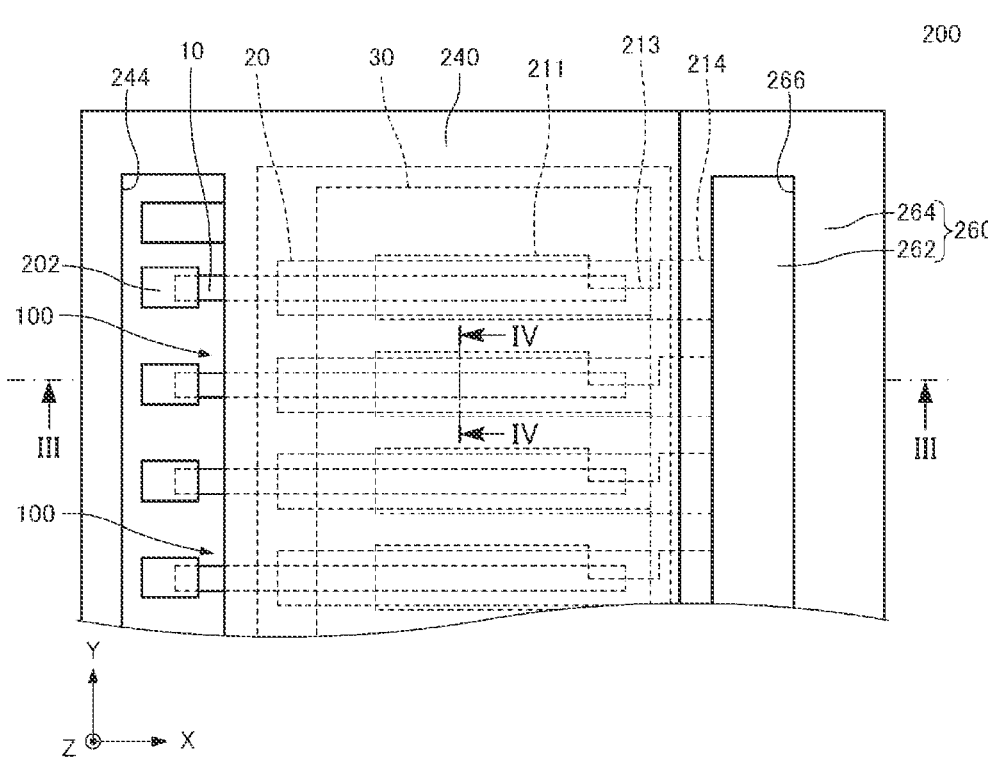
FIG. 2 is a plan view schematically showing the droplet ejection head 200 according to the embodiment.
Figure 3:
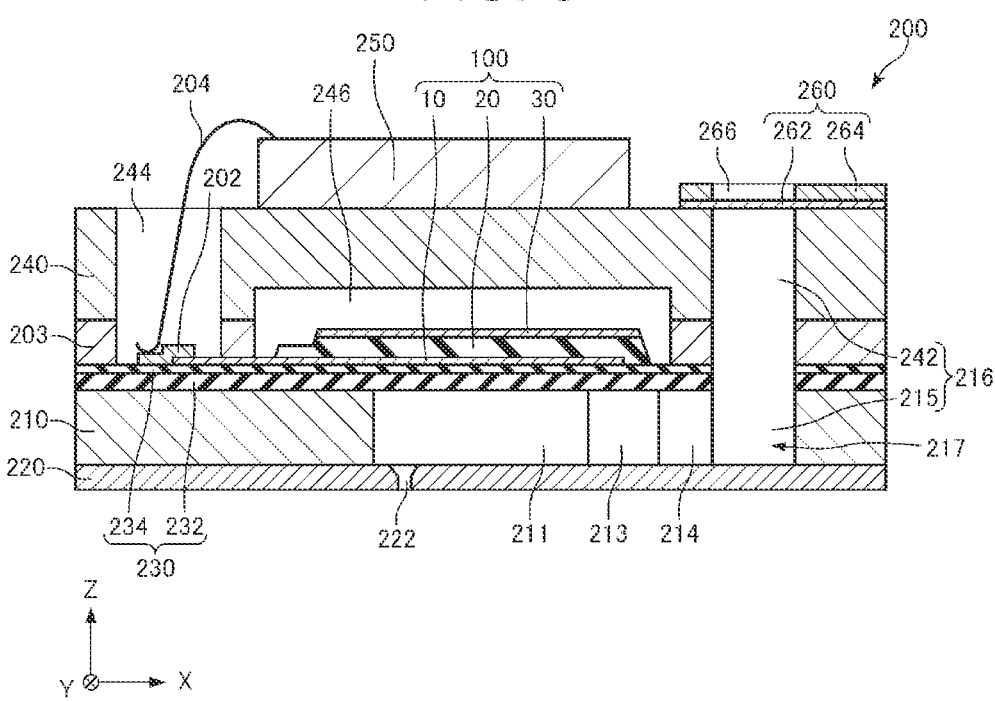
FIG. 3 is a cross-sectional view taken along a line III-III in FIG. 2.
Figure 4:
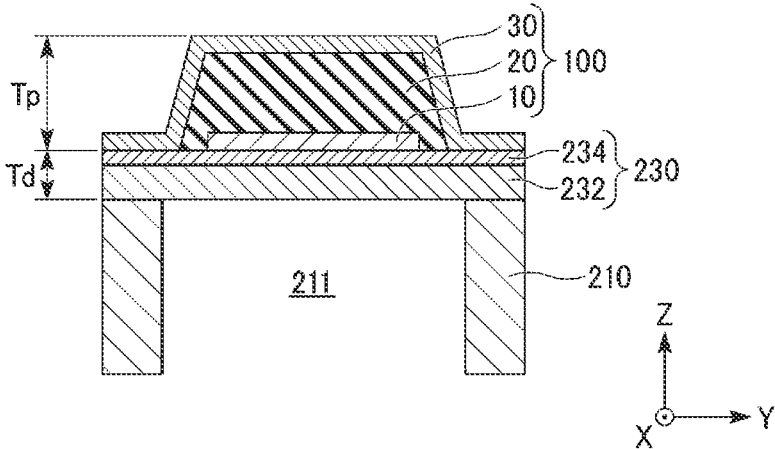
FIG. 4 is a cross-sectional view taken along a line IV-IV in FIG. 2.

FIG. 1 is an exploded perspective view schematically showing a droplet ejection head 200 according to the embodiment. FIG. 2 is a plan view schematically showing the droplet ejection head 200 according to the embodiment. FIG. 3 is a cross-sectional view taken along a line III-III in FIG. 2. FIG. 4 is a cross-sectional view taken along a line IV-IV in FIG. 2. FIGS. 2 and 3 show piezoelectric elements 100 in a simplified manner.

As shown in FIGS. 1 to 3, the droplet ejection head 200 includes a plurality of piezoelectric elements 100, a pressure chamber forming substrate 210, a nozzle plate 220, a vibration plate 230, a protective substrate 240, a circuit board 250, and a compliance substrate 260. FIG. 2 does not show the circuit board 250. In the embodiment, the plurality of piezoelectric elements 100 are arranged along the Y-axis direction.

The pressure chamber forming substrate 210 is, for example, a silicon substrate. The pressure chamber forming substrate 210 is provided with pressure chambers 211. The pressure chambers 211 are partitioned by a plurality of partition walls 212. A volume of each pressure chamber 211 changes due to movement of the piezoelectric element 100.

In the pressure chamber forming substrate 210, a first communication path 213 and a second communication path 214 are provided at an end of the pressure chamber 211 in a +X-axis direction. The first communication path 213 is formed such that an opening area thereof is reduced by narrowing an end of the pressure chamber 211 in the +X-axis direction from the Y-axis direction. A width of the second communication path 214 in the Y-axis direction is, for example, the same as a width of the pressure chamber 211 in the Y-axis direction. A third communication path 215 communicating with a plurality of second communication paths 214 is formed in the +X-axis direction of the second communication paths 214. The third communication path 215 forms a part of a manifold 216. The manifold 216 serves as a liquid chamber common to the pressure chambers 211. As described above, the pressure chamber forming substrate 210 is provided with the pressure chamber 211, and a supply flow path 217 including the first communication path 213, the second communication path 214, and the third communication path 215. The supply flow path 217 communicates with the pressure chamber 211 and supplies a liquid to the pressure chamber 211.

The nozzle plate 220 is attached to one surface of the pressure chamber forming substrate 210. A material of the nozzle plate 220 is, for example, steel use stainless (SUS). The nozzle plate 220 is bonded to the pressure chamber forming substrate 210 by, for example, an adhesive or a thermal welding film. The nozzle plate 220 is provided with a plurality of nozzles 222 arranged along the Y-axis direction. The nozzle 222 communicates with the inside of the pressure chamber 211 and ejects the liquid.

The vibration plate 230 is provided on the other surface of the pressure chamber forming substrate 210. The vibration plate 230 includes, for example, a silicon oxide layer 232 provided on the pressure chamber forming substrate 210 and a zirconium oxide layer 234 provided on the silicon oxide layer 232. The vibration plate 230 may be a single-layer silicon oxide layer or a single-layer zirconium oxide layer. A thickness of the vibration plate 230 is, for example, 0.5 $\mu$m or more and 3 $\mu$m or less.

The piezoelectric element 100 is provided on the vibration plate 230. A plurality of piezoelectric elements 100 are provided. The number of piezoelectric elements 100 is not particularly limited. Each piezoelectric element 100 includes a first electrode 10, a piezoelectric layer 20, and a second electrode 30.

The first electrode 10 is provided on the vibration plate 230. The first electrode 10 is provided between the vibration plate 230 and the piezoelectric layer 20. A thickness of the first electrode 10 is, for example, 3 nm or more and 300 nm or less. The first electrode 10 is, for example, a metal layer such as a platinum layer, an iridium layer, a titanium layer, or a ruthenium layer, a conductive oxide layer thereof, a lanthanum nickelate (LaNiO$_3$:LNO) layer, or a strontium ruthenate (SrRuO$_3$:SRO) layer. The first electrode 10 may have a structure in which a plurality of layers exemplified above are laminated.

In the droplet ejection head 200, the first electrode 10 is formed as an individual electrode that is independent for each pressure chamber 211. A width of the first electrode 10 in the Y-axis direction is narrower than the width of the pressure chamber 211 in the Y-axis direction. A length of the first electrode 10 in the X-axis direction is larger than a length of the pressure chamber 211 in the X-axis direction. In the X-axis direction, both ends of the first electrode 10 are located to sandwich both ends of the pressure chamber 211. A lead electrode 202 is coupled to an end of the first electrode 10 in a −X-axis direction.

The piezoelectric layer 20 is provided on the first electrode 10. The piezoelectric layer 20 is provided between the first electrode 10 and the second electrode 30. In the embodiment, the piezoelectric layer 20 is provided on the first electrode 10 and the vibration plate 230. A thickness of the piezoelectric layer 20 is, for example, 100 nm or more and 3 $\mu$m or less. The piezoelectric layer 20 can be deformed by applying a voltage between the first electrode 10 and the second electrode 30.

The piezoelectric layer 20 is a KNN layer containing potassium (K), sodium (Na), and niobium (Nb). The piezoelectric layer 20 has a perovskite structure. In the piezoelectric layer 20, a ratio DA/DB of an atomic concentration DA at an A site to an atomic concentration DB at a B site is, for example, 1.01 or more and 1.10 or less, and preferably 1.02 or more and 1.06 or less. When the piezoelectric layer 20 is a KNN layer, in the piezoelectric layer 20, a total of the number of potassium atoms and the number of sodium atoms is larger than the number of niobium atoms by, for example, 1% or more and 10% or less, preferably 2% or more and 6% or less.

A width of the piezoelectric layer 20 in the Y-axis direction is, for example, larger than the width of the first electrode 10 in the Y-axis direction. A length of the piezoelectric layer 20 in the X-axis direction is larger than the length of the pressure chamber 211 in the X-axis direction. An end of the first electrode 10 in the +X-axis direction is located between an end of the piezoelectric layer 20 in the +X-axis direction and the end of the pressure chamber 211 in the +X-axis direction. The end of the first electrode 10 in the +X-axis direction is covered with the piezoelectric layer 20. On the other hand, an end of the piezoelectric layer 20 in the −X-axis direction is located, for example, between the end of the first electrode 10 in the −X-axis direction and the end of the pressure chamber 211 in the +X-axis direction.

The end of the first electrode 10 in the −X-axis direction is not covered with the piezoelectric layer 20.

The second electrode 30 is provided on the piezoelectric layer 20. In the embodiment, the second electrode 30 is provided continuously on the piezoelectric layer 20 and the vibration plate 230. The second electrode 30 is formed as a common electrode common to the plurality of piezoelectric elements 100. A thickness of the second electrode 30 is, for example, 3 nm or more and 300 nm or less. The second electrode 30 is, for example, a metal layer such as an iridium layer, a platinum layer, a titanium layer, or a ruthenium layer, a conductive oxide layer thereof, a lanthanum nickelate layer, or a strontium ruthenate layer. The second electrode 30 may have a structure in which a plurality of layers exemplified above are laminated.

In the piezoelectric element 100, by applying a voltage between the first electrode 10 which is a lower electrode, and the second electrode 30 which is an upper electrode, it is possible to apply a voltage to the piezoelectric layer 20 and deform the piezoelectric layer 20. The piezoelectric element 100 and the vibration plate 230 function as a piezoelectric actuator that changes a volume of the pressure chamber 211.

In the droplet ejection head 200, the vibration plate 230 and the first electrode 10 are displaced by deformation of the piezoelectric layer 20, which has electromechanical conversion characteristics. That is, in the droplet ejection head 200, the vibration plate 230 and the first electrode 10 substantially function as a vibration plate.

The protective substrate 240 is bonded to the vibration plate 230 by an adhesive 203. A through hole 242 is formed in the protective substrate 240. In the shown example, the through hole 242 penetrates the protective substrate 240 in the Z-axis direction and communicates with the third communication path 215. The through hole 242 and the third communication path 215 form the manifold 216, which serves as the liquid chamber common to the pressure chambers 211. The protective substrate 240 further has a through hole 244 penetrating the protective substrate 240 in the Z-axis direction. An end of the lead electrode 202 is located in the through hole 244.

An opening 246 is formed in the protective substrate 240. The opening 246 is a space that does not hinder driving of the piezoelectric element 100. The opening 246 may be sealed or may not be sealed.

The circuit board 250 is provided on the protective substrate 240. The circuit board 250 includes an integrated circuit (IC) for driving the piezoelectric element 100. The circuit board 250 and the lead electrode 202 are electrically coupled to each other via a coupling wiring 204.

The compliance substrate 260 is provided on the protective substrate 240. The compliance substrate 260 includes a sealing layer 262 provided on the protective substrate 240 and a fixing plate 264 provided on the sealing layer 262. The sealing layer 262 is a layer for sealing the manifold 216. The sealing layer 262 has, for example, flexibility. The fixing plate 264 has a through hole 266. The through hole 266 penetrates the fixing plate 264 in the Z-axis direction. The through hole 266 is formed at a position overlapping the manifold 216 when viewed from the Z-axis direction.

Hereinafter, the piezoelectric element 100 according to the embodiment will be described in more detail.

In the embodiment, as shown in FIG. 4, a thickness Tp of the piezoelectric element 100, that is, a total thickness Tp of the piezoelectric layer 20, the first electrode 10, and the second electrode 30, is larger than a thickness Td of the vibration plate 230. The piezoelectric layer 20 according to the embodiment is the KNN layer and is made of a material having a piezoelectric constant lower than that of PZT. By making the thickness Td of the vibration plate 230 smaller than the thickness Tp of the piezoelectric element 100, it is possible to weaken rigidity of the vibration plate 230 and increase responsiveness of the vibration plate 230 to an input of a driving voltage.

Figure 5A:
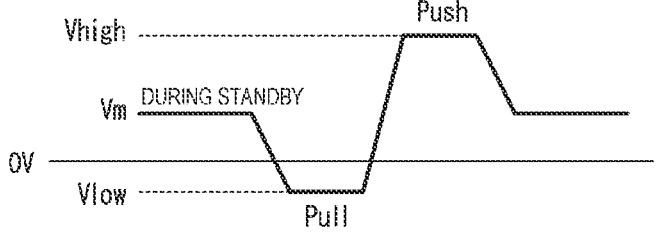
FIG. 5A is a schematic diagram showing an example of a driving voltage waveform input to a piezoelectric element 100.
Figure 5B:
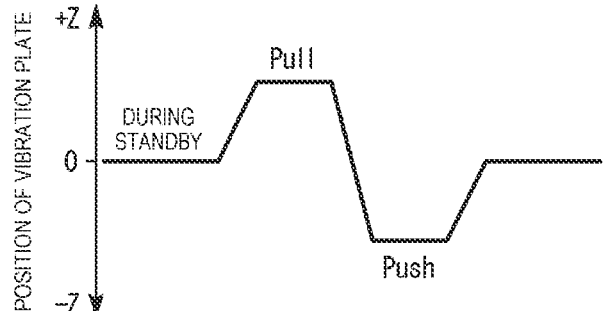
FIG. 5B is a schematic diagram showing a change in a position of a vibration plate 230 corresponding to the driving voltage waveform in FIG. 5A.
Figure 5C:
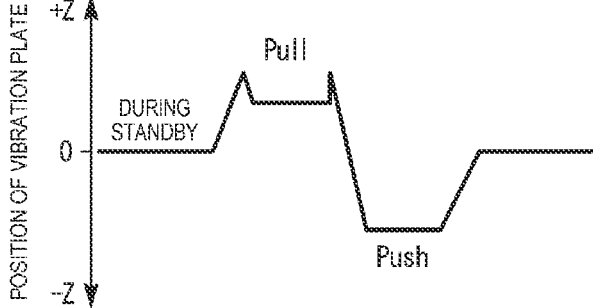
FIG. 5C is a schematic diagram showing an example in which an overshoot occurs.

FIG. 5A is a diagram showing an example of a driving voltage waveform input to the piezoelectric element 100. FIG. 5B is a diagram showing a change in a position of the vibration plate 230 corresponding to the driving voltage waveform in FIG. 5A. FIG. 5C is a diagram showing an example in which an overshoot occurs. FIG. 5D is a diagram showing a displacement behavior of the vibration plate 230 with respect to an applied voltage.

As shown in FIG. 5A, in an initial state, a certain positive voltage Vm is applied in order to keep an electrical state of the piezoelectric layer 20 constant (during standby). When the liquid is ejected from the nozzle 222, first, a voltage is lowered to Vlow to expand a volume of the pressure chamber 211, and the liquid is drawn into the pressure chamber 211 (pull operation). Vlow is shown as a negative voltage, but may be 0 V or a positive voltage. Next, a positive voltage Vhigh higher than Vm is applied to contract the volume of the pressure chamber 211, and the liquid is ejected from the nozzle 222 (push operation). Finally, the voltage is returned to Vm.

In a series of operations described above, setting the voltage Vlow during the pull operation is very important. FIG. 5B shows the change in the position of the vibration plate 230 when Vlow is ideal. In FIG. 5B, the position of the vibration plate 230 moves to an uppermost side (a side where the volume of the pressure chamber 211 is the largest) during the pull operation, and the position of the vibration plate 230 moves to a lowermost side (a side where the volume of the pressure chamber 211 is the smallest) during the push operation.

FIG. 5C shows a change in the position of the vibration plate 230 when Vlow is not ideal, particularly when Vlow is too low. Compared to FIG. 5B, movement of the vibration plate 230 during the pull operation is different, and the vibration plate 230 is stabilized after once moving to an uppermost side and then returning slightly to a lower side. That is, an unexpected positional change occurs in the vibration plate 230.

FIG. 5D shows a displacement behavior of the piezoelectric element and the vibration plate with respect to the applied voltage. The piezoelectric layer 20 of the piezoelectric element 100 has a property that a size of a crystal lattice changes due to extension of a crystal in a voltage application direction or orientation of a polarization direction. In principle, this property changes in the same direction regardless of the voltage application direction, for example, when the upper electrode (the second electrode 30) is set to a more positive voltage than the lower electrode (the first electrode 10), or when the upper electrode (the second electrode 30) is set to a more negative voltage than the lower electrode (the first electrode 10). The piezoelectric layer 20 has a voltage at which the size of the crystal lattice in the voltage application direction is minimized. This voltage changes due to parameters such as a type of a material forming the piezoelectric layer 20, a film thickness of the piezoelectric layer 20, a polarization direction and a degree of polarization of the piezoelectric layer 20, and a structure of the piezoelectric element 100 (piezoelectric capacitor) including the electrodes.

Ideally, a voltage during the pull operation is a voltage Vi at which the size of the crystal lattice in the voltage application direction described above is minimized. Since the voltage Vi changes due to various parameters, the voltage Vi changes depending on changes in the piezoelectric elements 100 forming one device and also changes by moving one piezoelectric element 100 for a long period of time. Therefore, it is difficult to avoid an unexpected positional change of the vibration plate 230 at the time of driving even if there is a certain degree of positional change.

In a configuration in which the piezoelectric layer 20 is formed of the KNN layer and the thickness Td of the vibration plate 230 is small as in the embodiment, the vibration plate 230 may be more likely to move than in a case where the vibration plate 230 is thick, and abnormal ejection may be likely to occur due to high-frequency vibration accompanying malfunction during the pull operation.

Therefore, in the droplet ejection head 200 according to the embodiment, a configuration is adopted in which an amount of unexpected displacement of the vibration plate 230 can be prevented even when a voltage during the pull operation deviates from the ideal voltage Vi.

Specifically, an absolute value of a displacement amount of the vibration plate 230 when a voltage having an absolute value of 25 V is applied to the piezoelectric element 100 as a voltage for displacing the vibration plate 230 in a direction in which a volume of the pressure chamber 211 expands is 1.5 times or more an absolute value of a displacement amount of the vibration plate 230 when a voltage having an absolute value of 25 V is applied to the piezoelectric element 100 as a voltage for displacing the vibration plate 230 in a direction in which a volume of the pressure chamber 211 contracts.

According to the above configuration, as described in the embodiment to be described later, it is possible to reduce a difference between a displacement amount of the vibration plate 230 at the time of overshoot and a displacement amount when a position of the vibration plate 230 is stabilized thereafter during the pull operation. Accordingly, an amplitude of the high-frequency vibration generated when the vibration plate 230 returns from the overshoot is also reduced. As a result, according to the droplet ejection head 200 according to the embodiment, it is possible to prevent occurrence of unintended abnormal ejection from the nozzles 222.

The piezoelectric element 100 according to the embodiment has asymmetry in which a displacement amount changes due to a direction of a voltage applied between the first electrode 10 and the second electrode 30.

By making the piezoelectric element 100 asymmetric in the displacement amount, electrical properties of the piezoelectric element 100 change. Specifically, a normal (related-art) piezoelectric element can be represented by a parallel circuit of a capacitor and a resistor as shown in FIG. 6A, whereas the piezoelectric element 100 according to the embodiment can be represented by a circuit having a structure in which a diode is inserted in series with a resistor as shown in FIG. 6B.

A displacement amount of the piezoelectric actuator including the piezoelectric element 100 and the vibration plate 230 shown in FIG. 6B changes due to a direction in which a voltage is applied. In the circuit shown in FIG. 6B, a combined resistance on a left side of the circuit changes by an amount of the diode due to the voltage application direction. In FIG. 6B, the combined resistance when a lower terminal is set to a high potential and an upper terminal is set to a low potential is larger than the combined resistance when the upper terminal is set to a high potential and the lower terminal is set to a low potential.

A magnitude of the combined resistance is electrically related to a dielectric loss of the circuit. In FIG. 6B, when the upper terminal is set to the high potential, the dielectric loss is larger than that in a case where the lower terminal is set to the high potential. A magnitude of the dielectric loss relates to a magnitude of a piezoelectric displacement amount. The smaller the dielectric loss is, the slightly larger the displacement amount is. In this way, as shown in FIG. 6B, the combined resistance changes due to the direction in which the voltage is applied, whereby it is possible to obtain a piezoelectric element in which the displacement amount is asymmetric with respect to the direction in which the voltage is applied.

In the embodiment, when Vlow deviates to a negative side from the ideal voltage Vi, an overshoot occurs in displacement of the vibration plate 230, and an unintended movement occurs in the vibration plate 230. In this case, a displacement amount of the overshoot is reduced by reducing a displacement amount in the pull operation as compared with the push operation. Therefore, in the embodiment, it is preferable that a resistance of the piezoelectric element 100 when a potential applied to the second electrode 30 is smaller than a potential applied to the first electrode 10 is larger than a resistance of the piezoelectric element 100 when a potential applied to the second electrode 30 is larger than a potential applied to the first electrode 10.

A plurality of methods can be used as a method for imparting asymmetry to the piezoelectric element 100, that is, as a method for differentiating a displacement amount when a positive voltage is applied and a displacement amount when a negative voltage is applied in the piezoelectric element 100.

Examples of the method include (asymmetry imparting method 1) a method of changing a material of an interface on a side close to the first electrode 10 or an interface on a side close to the second electrode 30 of the piezoelectric element 100 to change a Schottky barrier on one side, (asymmetry imparting method 2) a method of forming a composition gradient or an electrical gradient having directionality inside the piezoelectric layer 20 to create electrical directionality inside the piezoelectric layer 20, and the like. In the embodiment, since the asymmetry of the piezoelectric displacement amount may be finally obtained, either the method 1 or the method 2 may be used.

In a case of the asymmetry imparting method 1, a layer for changing the Schottky barrier is formed at either the interface between the first electrode 10 and the piezoelectric layer 20 or the interface between the piezoelectric layer 20 and the second electrode 30 of the piezoelectric element 100. A metal material, particularly a noble metal material such as platinum is often used as an electrode material of the first electrode 10 and the second electrode 30. Therefore, a conductive oxide material is suitable as the material of the interface for changing the Schottky barrier. For example, a $SrRuO_3$ layer or a $LaNiO_3$ layer may be formed at the interface between the first electrode 10 and the piezoelectric layer 20. Alternatively, an IrOx layer may be formed at the interface between the second electrode 30 and the piezoelectric layer 20.

In a case of the asymmetry imparting method 2, examples of a method for forming the composition gradient inside the piezoelectric layer 20 include a method of changing a starting material for forming the piezoelectric layer 20 between a lower layer and an upper layer of the piezoelectric layer 20, and a method of utilizing a difference in composition between a component to be crystallized first at a lower portion of a film formation unit and a component to be crystallized last at an upper portion by utilizing a difference in crystallization temperature of each component of a piezoelectric material formed of a mixture. Examples of a method for forming the electrical gradient inside the piezoelectric layer 20 include a method of forming a gradient in a state of crystal defects by utilizing a difference in crystallinity and a difference in internal stress between the upper portion and the lower portion of the piezoelectric layer 20.

Examples of the method for forming the piezoelectric layer 20 include a solution method in which a liquid precursor raw material is applied by a method such as spin coating, a solid phase method such as sputtering in which particles ejected by applying $Ar^+$ ions or the like to a solid target material are deposited on a surface of a base facing the target material, and a gas phase method in which a precursor raw material is deposited on a surface of a substrate in a form of a gas or vapor. In the embodiment, a piezoelectric thin film may be formed by any method, or the two or more methods may be used in combination.

In a case where the composition gradient is formed inside the piezoelectric layer 20 by the above-described method 2, it is preferable to adopt an appropriate film forming method of the piezoelectric layer 20 according to a formation form of the composition gradient. For example, when the piezoelectric layer 20 is formed by a solution method, a series of steps of applying a solution containing a precursor raw material and then drying, degreasing, and firing to crystallize the solution to form a piezoelectric film is repeated a plurality of times to form the piezoelectric layer 20 in which a plurality of piezoelectric films are laminated on a base. Such a solution method is preferable because the composition gradient can be relatively easily formed by changing a material of the solution or controlling firing conditions in the method for forming the composition gradient inside the piezoelectric layer 20 according to the asymmetry imparting method 2.

Figure 12:
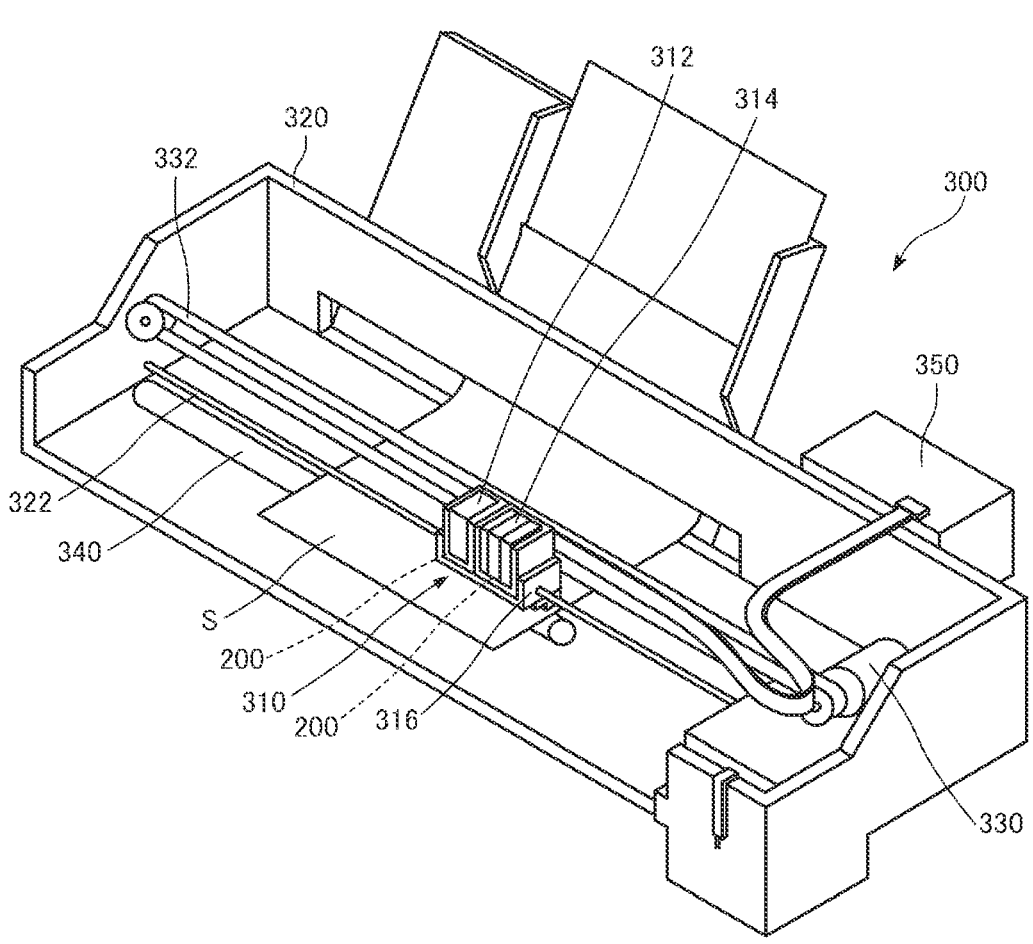
FIG. 12 is a perspective view schematically showing a printer 300 according to the embodiment.

In the method 1 described above, in a case where, for example, a conductive oxide layer is formed at an interface between the piezoelectric layer 20 and one of the upper and lower electrodes, film forming processing of a layer made of a conductive oxide or the like is performed before and after forming the piezoelectric layer 20 by using any one of a solution method, a solid phase method, and a gas phase method in the same manner as the piezoelectric layer 20.
Printer Next, a printer according to the embodiment will be described with reference to the drawings. FIG. 12 is a perspective view schematically showing a printer 300 according to the embodiment.

The printer 300 is an inkjet printer. As shown in FIG. 12, the printer 300 includes a head unit 310. The head unit 310 includes, for example, the droplet ejection head 200. The number of droplet ejection heads 200 is not particularly limited. The head unit 310 is detachably provided with cartridges 312, 314 forming a supply unit. A carriage 316 on which the head unit 310 is mounted is movable in an axial direction on a carriage shaft 322 attached to a device main body 320, and ejects a liquid supplied from a liquid supply unit.

Here, the liquid may be a material in a state in which a substance is in a liquid phase, and also include a material in a liquid state such as a sol or a gel. In addition, the liquid includes not only a liquid as one state of a substance, but also a liquid in which particles of a functional material formed of a solid material such as a pigment or a metal particle are dissolved, dispersed, or mixed in a solvent. Typical examples of the liquid include an ink and a liquid crystal emulsifier. The ink includes various liquid compositions such as a general water-based ink, an oil-based ink, a gel ink, and a hot-melt ink.

In the printer 300, a driving force of a driving motor 330 is transmitted to the carriage 316 via a plurality of gears (not shown) and a timing belt 332, whereby the carriage 316 on which the head unit 310 is mounted is moved along the carriage shaft 322. On the other hand, the device main body 320 is provided with a conveyance roller 340 as a conveyance mechanism that moves a sheet S, which is a recording medium such as paper, relative to the droplet ejection head 200. The conveyance mechanism that conveys the sheet S is not limited to the conveyance roller, and may be a belt, a drum, or the like.

The printer 300 includes a printer controller 350 as a control unit that controls the droplet ejection head 200 and the conveyance roller 340. The printer controller 350 is electrically coupled to the circuit board 250 of the droplet ejection head 200. The printer controller 350 includes, for example, a random access memory (RAM) that temporarily stores various types of data, a read only memory (ROM) that stores a control program and the like, a central processing unit (CPU), a driving signal generating circuit that generates a driving signal for supplying to the droplet ejection head 200, and the like.

The piezoelectric element 100 is not limited to a liquid ejection head and a printer, and can be used in a wide range of applications. The piezoelectric element 100 is suitably used as a piezoelectric actuator of, for example, an ultrasonic motor, a vibration type dust removing device, a piezoelectric transformer, a piezoelectric speaker, a piezoelectric pump, or a pressure-electric conversion device. The piezoelectric element 100 is preferably used as a piezoelectric sensor element of, for example, an ultrasonic detector, an angular velocity sensor, an acceleration sensor, a vibration sensor, an inclination sensor, a pressure sensor, a collision sensor, a motion sensor, an infrared sensor, a terahertz sensor, a heat detection sensor, a pyroelectric sensor, or a piezoelectric sensor. The piezoelectric element 100 is suitably used as a ferroelectric element of a ferroelectric memory (FeRAM), a ferroelectric transistor (FeFET), a ferroelectric arithmetic circuit (FeLogic), a ferroelectric capacitor, or the like. The piezoelectric element 100 is suitably used as a voltage-controlled optical element of a wavelength converter, an optical waveguide, an optical path modulator, a refractive index control element, an electronic shutter mechanism, or the like.

EXAMPLE

Figure 7:
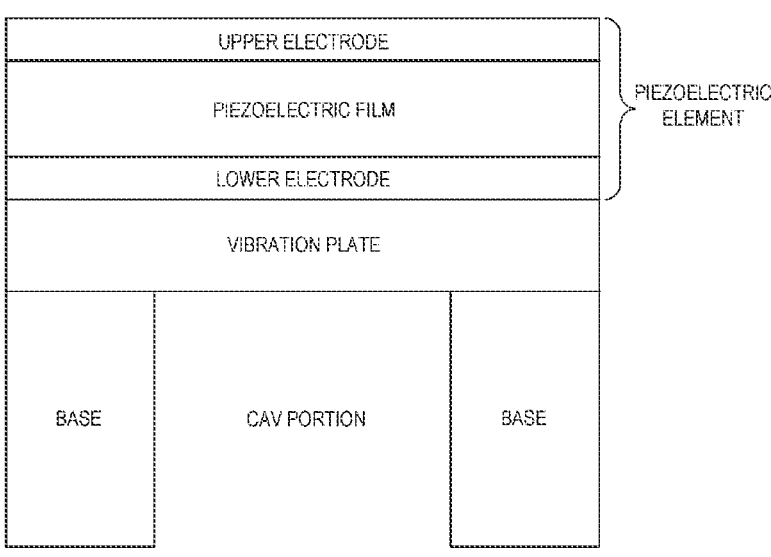
FIG. 7 is a schematic configuration diagram of a piezoelectric actuator manufactured in an example.

In this example, a piezoelectric actuator having a configuration shown in FIG. 7 was manufactured for evaluation. Three types of samples in Example, Comparative example 1, and Comparative example 2 were used, and a total film thickness of a piezoelectric element including an upper electrode, a piezoelectric layer, and a lower electrode was different from a total film thickness of a vibration plate. Except for the above conditions of the total film thickness, the following common manufacturing steps were used.
Manufacturing Steps First, a single crystal silicon substrate having a (110) plane on a surface was thermally oxidized to form a $SiO_2$ layer. Next, a Zr layer was formed at the $SiO_2$ layer by direct current (DC) sputtering, and then a ZrOx layer was formed by heat treatment at 850° C. By the above process, a laminated vibration plate of ZrOx/SiO₂ was formed. In the single crystal silicon substrate, a portion that is not thermally oxidized is a base portion shown in FIG. 7.

Next, a piezoelectric element was formed at the vibration plate. First, a Ti layer was formed as an adhesion layer on the ZrOx layer. Next, a Pt layer and an Ir layer were sequentially formed on the Ti layer by DC sputtering to form a lower electrode.

Next, a surface of the Ir layer was irradiated with ultraviolet rays in vacuum for 10 minutes, and then exposed to a nitrogen atmosphere for one minute to clean the surface of the Ir layer. Then, a potassium sodium niobate (KNN) precursor solution was formed into a film having a thickness of 70 nm by spin coating, and a KNN layer was formed by lamp annealing in an oxygen atmosphere at 750° C. for three minutes. The KNN precursor solution was adjusted such that (K+Na):Nb=104:100 and K:Na=50:50.

Next, a layer above the ZrOx layer was patterned by ion milling. Next, a KNN precursor solution having the same composition as described above was formed into a film of 400 nm in total by spin coating of 11 layers. Each layer was subjected to lamp annealing in an oxygen atmosphere at 750° C. for three minutes to crystallize the KNN layer, thereby forming a piezoelectric layer. The Ir layer was oxidized in a step of forming the KNN layer to become an IrOx layer.

Next, a Pt layer was formed on the piezoelectric layer made of the KNN layer by DC sputtering to form an upper electrode.

Next, the upper electrode, the piezoelectric thin film, and the lower electrode were sequentially processed into a predetermined pattern by a method such as etching to form a piezoelectric element. A back surface of the silicon substrate was etched with KOH, for example, and processed into a predetermined pattern to form a pressure chamber of the piezoelectric actuator.

Film thickness conditions of each sample are as follows.

EXAMPLE

A total film thickness of the piezoelectric element was 2.2 μm, and a total film thickness of the vibration plate was 1.0 μm.

Comparative Example 1

A total film thickness of the piezoelectric element was 1.2 μm, and a total film thickness of the vibration plate was 2.0 μm. A material of the piezoelectric layer was the same as that of Example.

Comparative Example 2

A total film thickness of the piezoelectric element was 2.2 μm, and a total film thickness of the vibration plate was 2.4 μm. A material of the piezoelectric layer was the same as that of Example. A size of the pressure chamber was adjusted such that a side having a larger displacement amount was substantially the same as those of Example and Comparative Example 1.

Evaluation 1

Piezoelectric characteristics of the samples of piezoelectric actuators in Example and Comparative Examples 1 and 2 were evaluated. Measurement devices and measurement conditions are as follows.

Measurement device: Laser Doppler vibrometer NLV-2500 (manufactured by Polytec Co., Ltd.)

Function generator AFG3022C (manufactured by Tektronix Co., Ltd.)

Digital oscilloscope HDO4024 (manufactured by Lecroy Co., Ltd.)

Measurement conditions: frequency 2 kHz, sine wave

Vhigh=+25 V

Vlow=−25 V

Figure 8:
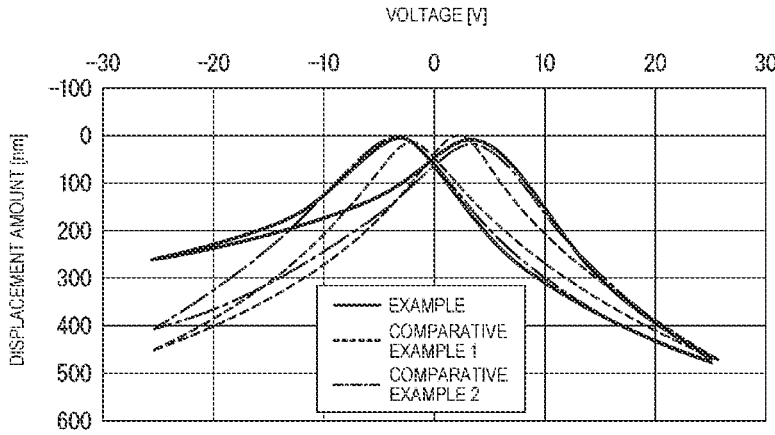
FIG. 8 is a graph showing evaluation results of piezoelectric characteristics.

FIG. 8 shows evaluation results. A displacement amount in a driving direction (positive voltage side) was 470 nm to 480 nm in each of the samples in Example and Comparative Examples 1 and 2. On the other hand, a displacement amount in a direction opposite to the driving direction (negative voltage side) was 400 nm to 450 nm in the samples in Comparative Examples 1 and 2, whereas was approximately 260 nm in the sample in Example, which was about half the displacement amount in the samples in Comparative Examples 1 and 2.

Evaluation 2

A driving waveform during a droplet ejection operation was input to the samples of the piezoelectric actuators in Example and Comparative Example 2, and a displacement behavior of the vibration plate was evaluated. Measurement devices and measurement conditions are as follows.

Measurement device: a laser Doppler vibrometer NLV-2500 (manufactured by Polytec Co., Ltd.), a function generator AFG3022C (manufactured by Tektronix Co., Ltd.), and a digital oscilloscope HDO4024 (manufactured by Lecroy Co., Ltd) were used.

Measurement conditions: Vlow=−10 V to 0 V (changing)

$$Vhigh=Vlow+25 \text{ V}$$

$$Vm=(Vlow+Vhigh)/2$$

Figure 9:
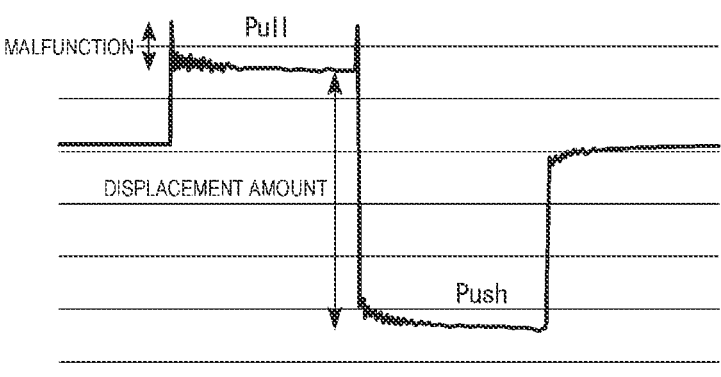
FIG. 9 is a diagram showing a displacement behavior when an overshoot occurs.

When setting of Vlow is not ideal, as shown in FIG. 9, an overshoot occurs at the time of pull, and displacement corresponding to malfunction is added to an original displacement amount (position where the displacement is stabilized).

Figures 10, 11:
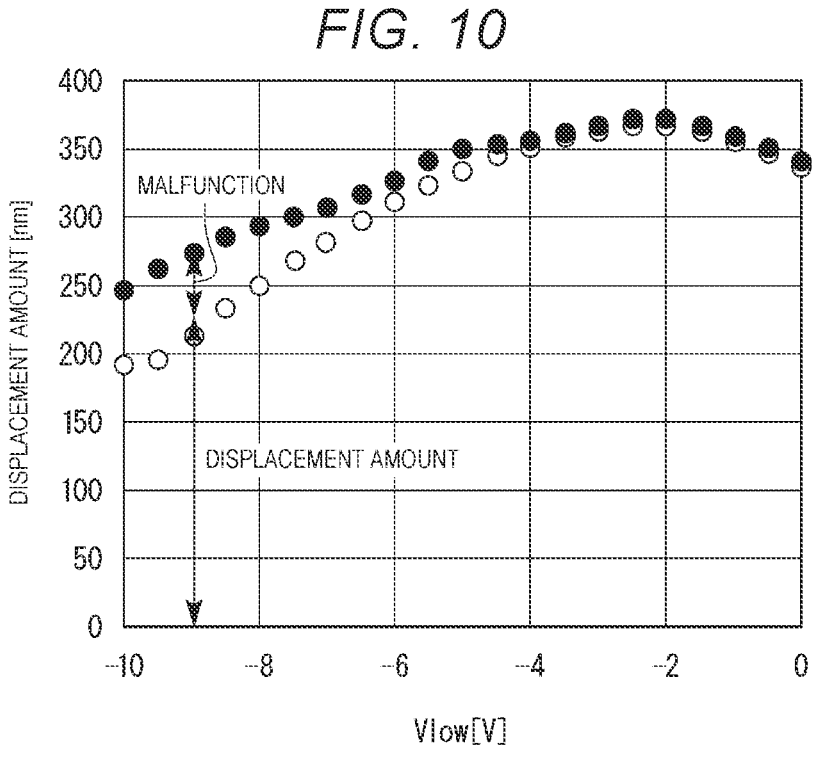
FIG. 10 is a graph showing a change in a displacement amount of the vibration plate with respect to Vlow as a comparison between an original displacement amount and a displacement amount resulting from displacement corresponding to malfunction.
FIG. 11 is a graph comparing a displacement amount at a stable displacement position when Vlow deviates from an ideal value to a negative side (~−10 V) with a displacement amount resulting from displacement corresponding to malfunction.

FIG. 10 shows a change in a displacement amount of the vibration plate with respect to Vlow as a comparison between an original displacement amount and a displacement amount resulting from displacement corresponding to malfunction. FIG. 11 is a graph comparing a displacement amount at a stable displacement position when Vlow deviates from an ideal value to a negative side (∼−10 V) with a displacement amount resulting from displacement corresponding to malfunction. As shown in FIG. 11, the larger Vlow deviates from the ideal value to the negative side, the larger the displacement due to the malfunction becomes.

Although not shown, it was confirmed that the malfunction hardly occurs when Vlow is ideal or deviates to a positive side.

FIG. 11 is a diagram comparing a ratio of the malfunction to the actual displacement amount between Example and Comparative Example 2. As shown in the drawing, it was confirmed that a change width of the displacement amount when Vlow deviates from the ideal value was smaller in the sample in Example than in the sample in Comparative Example 2, and malfunction was prevented.

What is claimed is:

1. A droplet ejection head comprising:
a nozzle plate having a nozzle configured to eject a liquid as droplets;

a substrate having a pressure chamber continuous to the nozzle;

a vibration plate forming a part of a wall surface of the pressure chamber; and a piezoelectric element containing potassium, sodium, and niobium and formed on the vibration plate, wherein the piezoelectric element includes a first electrode, a second electrode, and a piezoelectric layer located between the first electrode and the second electrode, a total thickness of the piezoelectric layer, the first electrode, and the second electrode is larger than a thickness of the vibration plate, and an absolute value of a displacement amount of the vibration plate when a voltage having an absolute value of 25 V is applied to the piezoelectric element as a voltage for displacing the vibration plate in a direction in which a volume of the pressure chamber expands is 2.0 times or more an absolute value of a displacement amount of the vibration plate when a voltage having an absolute value of 25 V is applied to the piezoelectric element as a voltage for displacing the vibration plate in a direction in which a volume of the pressure chamber contracts.

2. The droplet ejection head according to claim 1, wherein the piezoelectric layer is disposed between the vibration plate and the second electrode, and the first electrode is disposed between the vibration plate and the piezoelectric layer, and a resistance of the piezoelectric element when a potential applied to the second electrode is smaller than a potential applied to the first electrode is larger than a resistance of the piezoelectric element when a potential applied to the second electrode is larger than a potential applied to the first electrode.

3. The droplet ejection head according to claim 1, wherein the piezoelectric layer includes a plurality of piezoelectric films, and the plurality of piezoelectric films are disposed between the vibration plate and the second electrode such that each of the plurality of piezoelectric films overlap the vibration plate and the second electrode.

4. The droplet ejection head according to claim 1, wherein the first electrode or the second electrode contains a conductive oxide material.

5. A printer comprising:

the droplet ejection head according to claim 1;

a conveyance mechanism configured to move a recording medium relative to the droplet ejection head; and a control unit configured to control the droplet ejection head and the conveyance mechanism.

* * * * *